US012588571B2

(12) United States Patent
Kimura et al.

(10) Patent No.: US 12,588,571 B2
(45) Date of Patent: Mar. 24, 2026

(54) SEMICONDUCTOR DEVICE

(71) Applicant: Mitsubishi Electric Corporation, Tokyo (JP)

(72) Inventors: Yoshitaka Kimura, Tokyo (JP); Hiroyuki Masumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 482 days.

(21) Appl. No.: 17/372,226

(22) Filed: Jul. 9, 2021

(65) Prior Publication Data

US 2022/0223511 A1 Jul. 14, 2022

(30) Foreign Application Priority Data

Jan. 14, 2021 (JP) ................................. 2021-003999

(51) Int. Cl.
H01L 23/62 (2006.01)
H01L 23/00 (2006.01)
H01L 23/047 (2006.01)
H01L 23/498 (2006.01)

(52) U.S. Cl.
CPC ...... H01L 23/49833 (2013.01); H01L 23/047 (2013.01); H01L 23/49838 (2013.01); H01L 24/49 (2013.01); *H01L 2224/49175* (2013.01)

(58) Field of Classification Search
CPC .......... H01L 23/62; H01L 24/32; H01L 24/48
See application file for complete search history.

(56) References Cited

U.S. PATENT DOCUMENTS

| | | | | |
|---|---|---|---|---|
| 5,712,610 A | * | 1/1998 | Takeichi | H01H 85/046 |
| | | | | 337/416 |
| 2001/0052425 A1 | * | 12/2001 | Andoh | H05K 3/4069 |
| | | | | 428/209 |
| 2003/0001589 A1 | * | 1/2003 | Chan | G11C 17/18 |
| | | | | 324/550 |
| 2005/0189625 A1 | * | 9/2005 | Deodato | H01L 23/49503 |
| | | | | 257/E23.037 |

(Continued)

FOREIGN PATENT DOCUMENTS

| DE | 10 2020 200 196 A1 | 7/2020 |
|---|---|---|
| DE | 10 2020 208 911 A1 | 4/2021 |

(Continued)

OTHER PUBLICATIONS

An Office Action issued by the German Patent Office on May 12, 2022, which corresponds to German Patent Application No. 10 2021 126 908.3 and is related to U.S. Appl. No. 17/372,226; with English language translation.

(Continued)

*Primary Examiner* — Michele Fan
(74) *Attorney, Agent, or Firm* — Studebaker Brackett PLLC

(57) ABSTRACT

A semiconductor device includes: an insulating substrate including a circuit pattern; a semiconductor chip mounted on the insulating substrate and connected to the circuit pattern; and an overcurrent interruption mechanism constituted with a same material as material of the circuit pattern, connected to the circuit pattern in series, wherein when an overcurrent flows, the overcurrent interruption mechanism melts and is cut.

23 Claims, 7 Drawing Sheets

(56) References Cited

U.S. PATENT DOCUMENTS

| | | | | |
|---|---|---|---|---|
| 2007/0063312 A1* | 3/2007 | Takemoto | H01L 23/5256 | 257/E23.149 |
| 2010/0213569 A1* | 8/2010 | Wu | H01L 23/5256 | 257/529 |
| 2011/0075451 A1* | 3/2011 | Bayerer | H01L 24/85 | 257/692 |
| 2011/0097846 A1* | 4/2011 | Hwang | H01L 25/50 | 257/E21.585 |
| 2015/0372094 A1* | 12/2015 | Horii | H01L 21/048 | 257/77 |
| 2020/0235060 A1 | 7/2020 | Kitabayashi et al. | | |
| 2021/0126513 A1 | 4/2021 | Shirakata et al. | | |

FOREIGN PATENT DOCUMENTS

| | | | | | |
|---|---|---|---|---|---|
| JP | 10261850 | A | * | 9/1998 | |
| JP | 2002056767 | A | * | 2/2002 | |
| JP | 2002373566 | A | * | 12/2002 | H01H 69/022 |
| JP | 2005135664 | A | * | 5/2005 | H01H 69/022 |
| JP | 2006040798 | A | * | 2/2006 | |
| JP | 2007-123644 | A | | 5/2007 | |
| JP | 2008118010 | A | * | 5/2008 | H01L 24/36 |
| JP | 2008-235502 | A | | 10/2008 | |
| JP | 2008235651 | A | * | 10/2008 | |
| JP | 2008243757 | A | * | 10/2008 | |
| JP | 2012-204576 | A | | 10/2012 | |
| WO | 2018/193581 | A1 | | 10/2018 | |

OTHER PUBLICATIONS

An Office Action issued by the German Patent and Trade Mark Office on Sep. 7, 2022, which corresponds to German Patent Application No. 102021126908.3 and is related to U.S. Appl. No. 17/372,226; with English language translation.

An Office Action; "Notice of Reasons for Refusal," mailed by the Japanese Patent Office on Oct. 24, 2023, which corresponds to Japanese Patent Application No. 2021-003999 and is related to U.S. Appl. No. 17/372,226; with English language translation.

An Office Action; mailed by the China National Intellectual Property Administration of the People's Republic of China on Sep. 19, 2024, which corresponds to Chinese Patent Application No. 202210017507.2 and is related to U.S. Appl. No. 17/372,226.

An Office Action; mailed by the China National Intellectual Property Administration of the People's Republic of China on Feb. 13, 2025, which corresponds to Chinese Patent Application No. 202210017507.2 and is related to U.S. Appl. No. 17/372,226.

An Office Action; mailed by the China National Intellectual Property Administration of the People's Republic of China on Jun. 18, 2025, which corresponds to Chinese Patent Application No. 202210017507.2 and is related to U.S. Appl. No. 17/372,226.

* cited by examiner

MACHINE
PROCESSING

SEMICONDUCTOR DEVICE

BACKGROUND OF THE INVENTION

Field

The present disclosure relates to a semiconductor device.

Background

It has been proposed to provide a protection mechanism for protecting a semiconductor chip, or the like, by melting and being cut when an overcurrent flows, for example, at a semiconductor device to be used for controlling a large current (see, for example, JP 2007-123644 A).

SUMMARY

In related art, a material of the protection mechanism is nickel or aluminum, which is different from a material of a circuit pattern of copper. Thus, there is a possibility that the different metals may deform differently in a temperature cycle upon driving of devices. This causes a problem of degradation of reliability due to deterioration of a solder joint portion of the protection mechanism and the circuit pattern.

The present disclosure has been made to solve the problem as described above, and an object of the present disclosure is to provide a semiconductor device which is capable of securing reliability.

A semiconductor device according to the present disclosure includes: an insulating substrate including a circuit pattern; a semiconductor chip mounted on the insulating substrate and connected to the circuit pattern; and an overcurrent interruption mechanism constituted with a same material as material of the circuit pattern, connected to the circuit pattern in series, wherein when an overcurrent flows, the overcurrent interruption mechanism melts and is cut.

In the present disclosure, the overcurrent interruption mechanism is constituted with the same material as the material of the circuit pattern. Thus, both components deform in a similar manner in a temperature cycle upon driving of devices, and joined portions of the overcurrent interruption mechanism and the circuit pattern do not deteriorate, so that reliability can be secured.

Other and further objects, features and advantages of the invention will appear more fully from the following description.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figure 1:
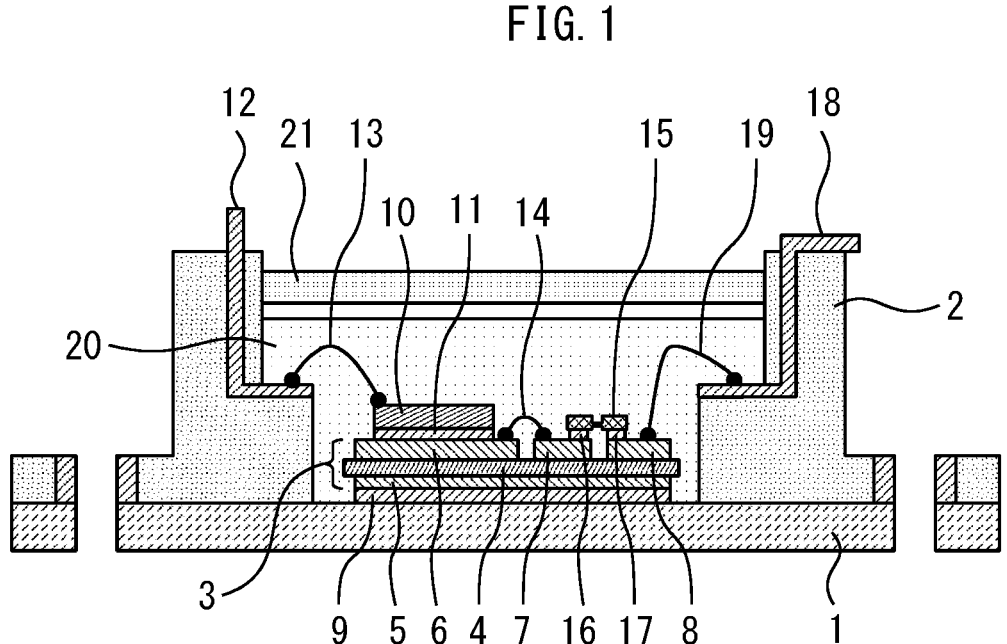
FIG. 1 is a cross-sectional view illustrating a semiconductor device according to a first embodiment.

FIG. 1 is a cross-sectional view illustrating a semiconductor device according to a first embodiment. A case 2 is joined on a metal base plate 1. An insulating substrate 3 is provided on the base plate 1 inside the case 2. The insulating substrate 3 includes an insulating plate 4 formed of ceramics or the like, a metal pattern 5 on a lower surface of the insulating plate 4, and circuit patterns 6, 7 and 8 on an upper surface of the insulating plate 4. The metal pattern 5 is joined on the base plate 1 with solder 9. The circuit patterns 6, 7 and 8 are formed of copper such as C1020 and C1921.

A semiconductor chip 10 is mounted on the insulating substrate 3. A lower electrode of the semiconductor chip 10 is connected to the circuit pattern 6 with solder 11. An upper electrode of the semiconductor chip 10 is connected to an electrode 12 of the case 2 through a wire 13.

One end of the circuit pattern 6 is connected to one end of the circuit pattern 7 with a wire 14. One end of an overcurrent interruption mechanism 15 is connected to the other end of the circuit pattern 7 with solder 16, and the other end of the overcurrent interruption mechanism 15 is connected to one end of the circuit pattern 8 with solder 17. By this means, the overcurrent interruption mechanism 15 is connected to the circuit patterns 6, 7 and 8 in series. The overcurrent interruption mechanism 15 is constituted with the same material as the material of the circuit patterns 6, 7 and 8.

The other end of the circuit pattern 8 is connected to an electrode 18 of the case 2 with a wire 19. A sealing material 20 fills inside of the case 2 and seals the insulating substrate 3, the semiconductor chip 10, and the like. An upper part of the case 2 is covered with a lid 21.

Figure 2:
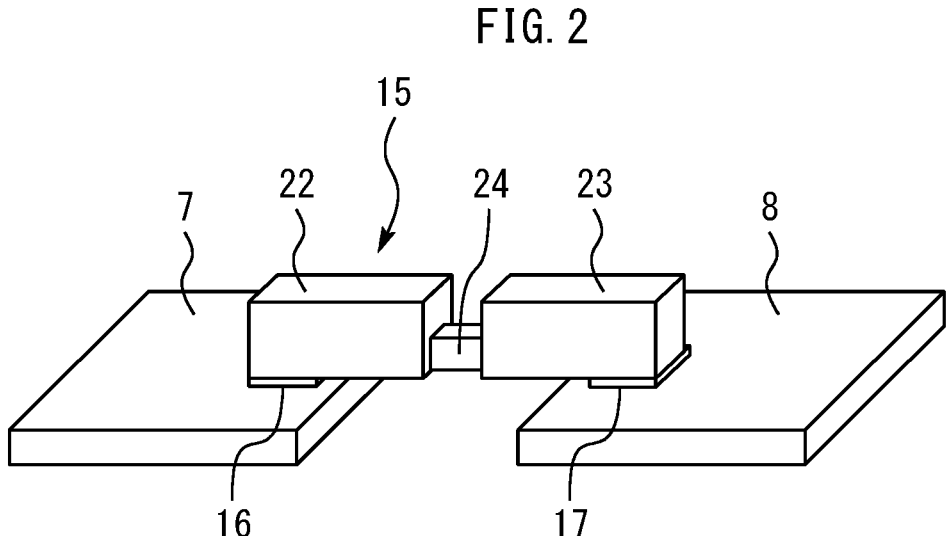
FIG. 2 is a perspective view illustrating the overcurrent interruption mechanism according to the first embodiment.

FIG. 2 is a perspective view illustrating the overcurrent interruption mechanism according to the first embodiment. The overcurrent interruption mechanism 15 includes a first conductor portion 22, a second conductor portion 23, and a constricted portion 24 connected between the first conductor portion 22 and the second conductor portion 23. The first conductor portion 22 is connected to the circuit pattern 7 with solder 16. The second conductor portion 23 is connected to the circuit pattern 8 with solder 17.

When an overcurrent flows, the constricted portion 24 of the overcurrent interruption mechanism 15 melts and is cut. This prevents the overcurrent from continuing to flow to the circuit patterns 6, 7 and 8 and can minimize influence of breakage of the semiconductor device on surroundings. For example, the overcurrent interruption mechanism 15 cuts off an overcurrent equal to or higher than 50 kA in an article whose rated current value which is a current value during normal operation is equivalent to 200 A.

Cross-sectional areas S of the first and second conductor portions 22 and 23 are larger than a cross-sectional area S' of the constricted portion 24 (S >S'). Lengths L of the first and second conductor portions 22 and 23 are longer than a length L' of the constricted portion 24 (L>L'). This can prevent increase of a temperature of the constricted portion 24 during normal operation such as upon motor driving. Further, the overcurrent interruption mechanism 15 can be incorporated without raising an electrode temperature. Further, by shortening the length L' of the constricted portion 24, it is possible to prevent degradation of circuit inductance and prevent increase of the temperature of the constricted portion 24 during normal operation. Further, thicknesses of the first and second conductor portions 22 and 23 are preferably equal to or greater than 0.5 mm. This can achieve the overcurrent interruption mechanism 15 without impairing energization capability during normal operation.

Figure 3:
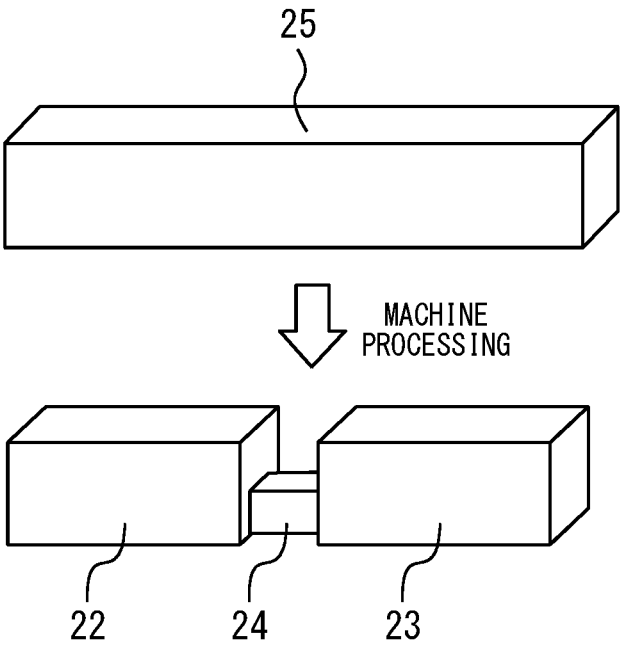
FIG. 3 is a perspective view illustrating a manufacturing process of the overcurrent interruption mechanism according to the first embodiment.

FIG. 3 is a perspective view illustrating a manufacturing process of the overcurrent interruption mechanism according to the first embodiment. The constricted portion 24 and the first and second conductor portions 22 and 23 of the overcurrent interruption mechanism 15 are formed by performing machine processing on one conductor 25. Thus, the overcurrent interruption mechanism 15 is constituted from one conductor, and thus, the overcurrent interruption mechanism 15 does not have a portion where different types are joined. As a result of this, there is no deterioration at a joined portion inside the overcurrent interruption mechanism 15, so that long-term reliability is improved.

As described above, in the present embodiment, the overcurrent interruption mechanism 15 is constituted with the same material as the material of the circuit patterns 6, 7 and 8. Thus, both components deform in a similar manner in a temperature cycle upon driving of devices, and joined portions of the overcurrent interruption mechanism 15 and the circuit patterns 7 and 8 do not deteriorate, so that reliability can be secured.

Further, the overcurrent interruption mechanism 15 is connected to the circuit patterns 7 and 8. Thus, heat by self-heating of the overcurrent interruption mechanism 15 is dissipated on the base plate 1 side through the circuit patterns 7 and 8. This can prevent increase of a temperature during normal operation.

Second Embodiment

Figure 4:
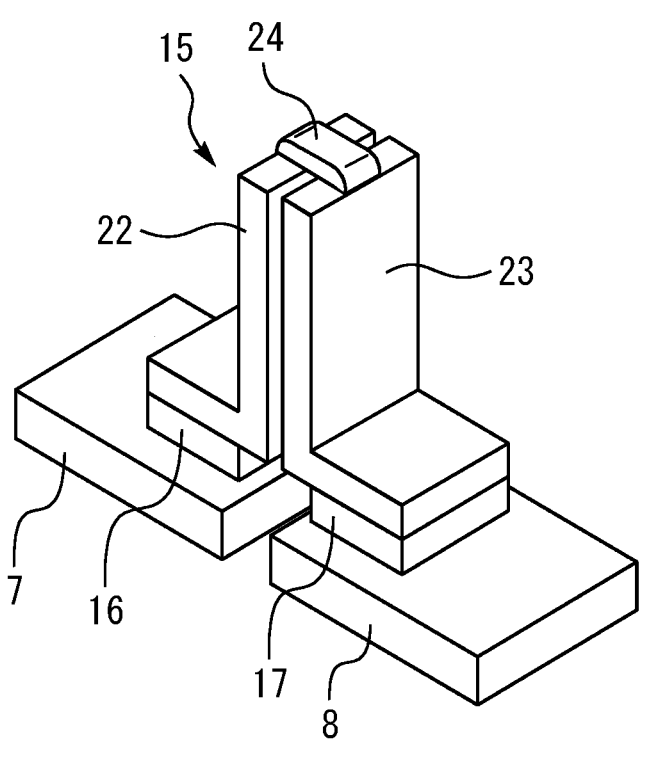
FIG. 4 is a perspective view illustrating an overcurrent interruption mechanism according to a second embodiment.
Figure 5:
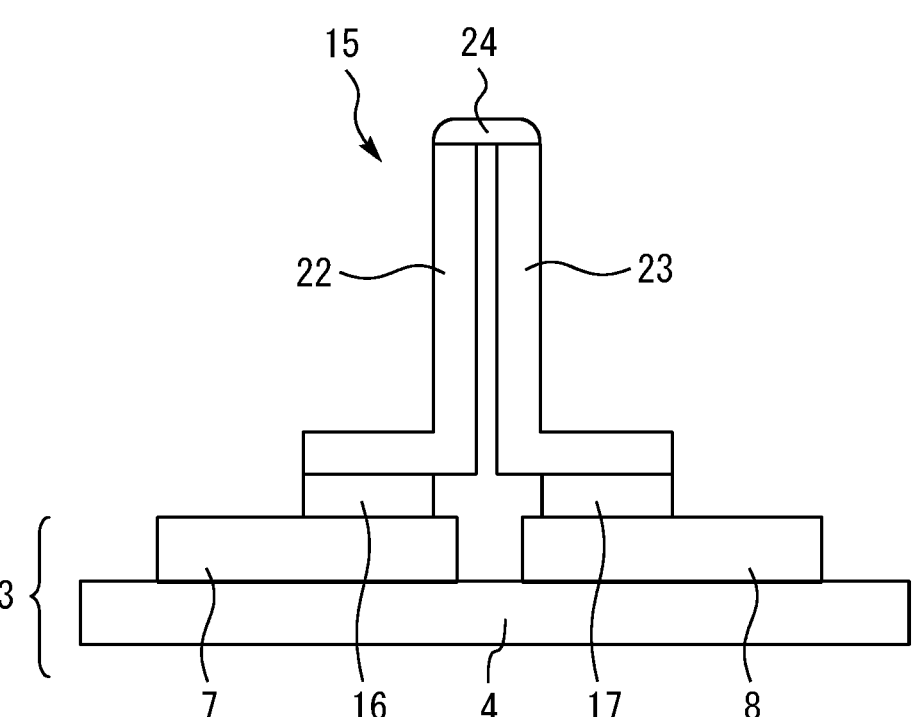
FIG. 5 is a cross-sectional view illustrating the overcurrent interruption mechanism according to the second embodiment.

FIG. 4 is a perspective view illustrating an overcurrent interruption mechanism according to a second embodiment. FIG. 5 is a cross-sectional view illustrating the overcurrent interruption mechanism according to the second embodiment. The first and second conductor portions 22 and 23 of the overcurrent interruption mechanism 15 constitute parallel plates standing erect with respect to an upper surface of the insulating substrate 3. This can secure a distance from the insulating substrate 3 to the constricted portion 24. Thus, impact when an overcurrent flows and the constricted portion 24 ruptures can be easily released to outside of the device, so that it is possible to prevent breakage of the insulating substrate 3. Further, insulation of the semiconductor device can be secured, so that it is possible to prevent a current from leaking to inside of a device to which the semiconductor device is to be attached. Further, the overcurrent interruption mechanism 15 has a parallel plate shape, so that it is possible to prevent increase of inductance of the overcurrent interruption mechanism 15. Other configurations and effects are similar to those in the first embodiment.

Third Embodiment

Figure 6:
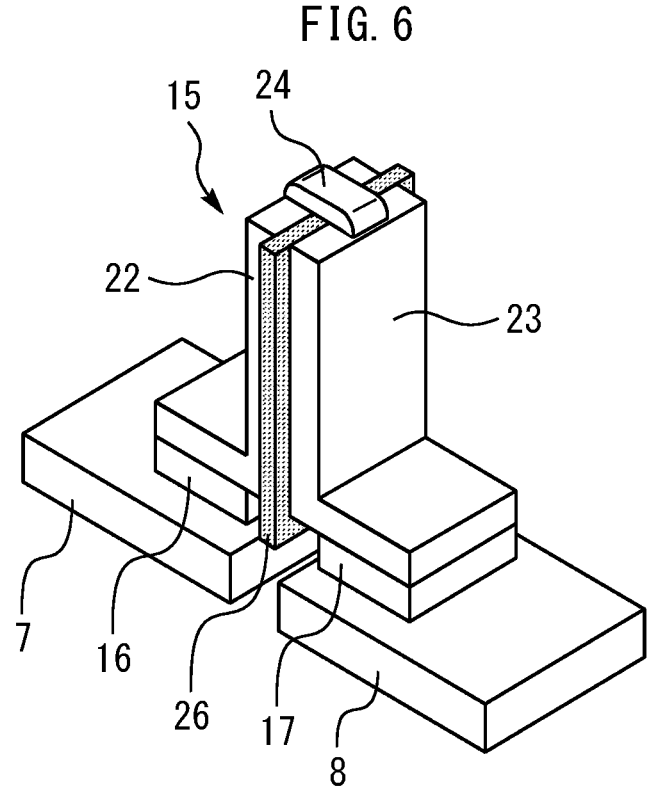
FIG. 6 is a perspective view illustrating an overcurrent interruption mechanism according to a third embodiment.
Figure 7:
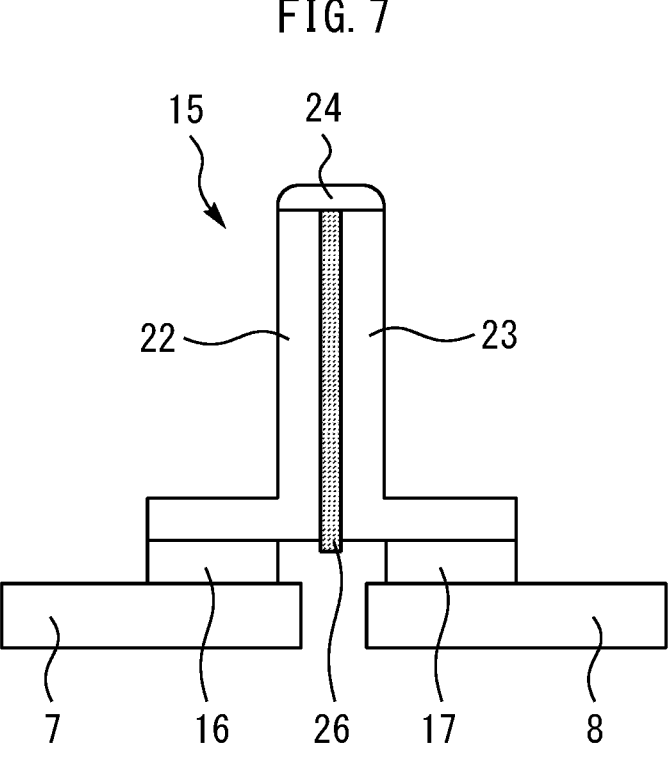
FIG. 7 is a cross-sectional view illustrating the overcurrent interruption mechanism according to the third embodiment.

FIG. 6 is a perspective view illustrating an overcurrent interruption mechanism according to a third embodiment. FIG. 7 is a cross-sectional view illustrating the overcurrent interruption mechanism according to the third embodiment. In the second embodiment, in a case where the first and second conductor portions 22 and 23 which constitute the parallel plates contact with each other, a current does not flow through the constricted portion 24, and an interruption function is impaired. Thus, in the present embodiment, an insulator 26 is inserted between the first and second conductor portions 22 and 23 which constitute the parallel plates. This can prevent impairment of the interruption function as a result of the first and second conductor portions 22 and 23 which constitute the parallel plates contacting with each other. Other configurations and effects are similar to those in the second embodiment.

Fourth Embodiment

Figure 8:
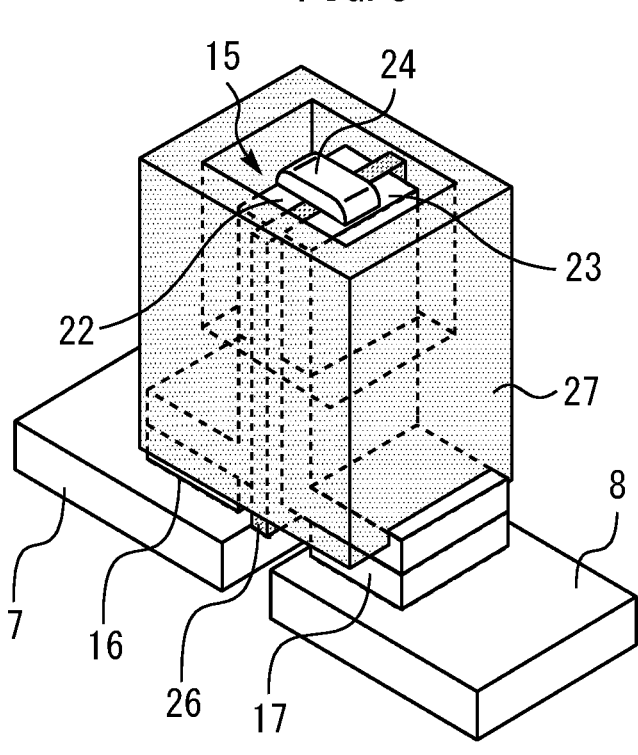
FIG. 8 is a perspective view illustrating an overcurrent interruption mechanism according to a fourth embodiment.
Figure 9:
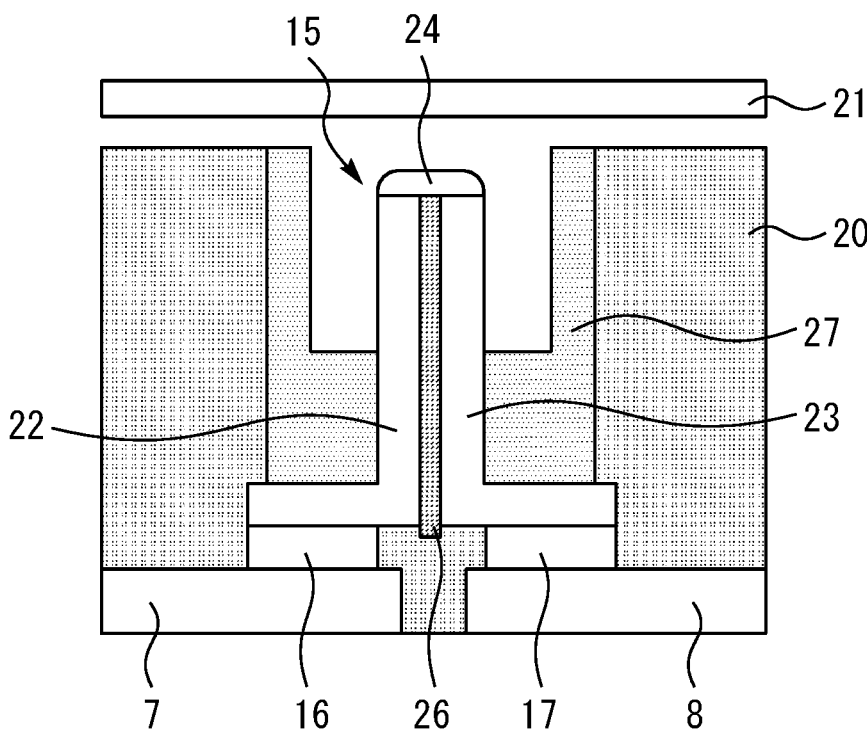
FIG. 9 is a cross-sectional view illustrating the overcurrent interruption mechanism according to the fourth embodiment.

FIG. 8 is a perspective view illustrating an overcurrent interruption mechanism according to a fourth embodiment. FIG. 9 is a cross-sectional view illustrating the overcurrent interruption mechanism according to the fourth embodiment. A chassis 27 is provided around the overcurrent interruption mechanism 15. The constricted portion 24 is positioned in a hollow inside the chassis 27. At least one surface of the constricted portion 24 is exposed from a rigid sealing material 20 such as an epoxy resin. This can provide a stable interruption mechanism.

However, if the constricted portion 24 is exposed to an outermost peripheral portion of the device, there is a concern that peripheral parts may be damaged upon current interruption. Thus, in the present embodiment, the constricted portion 24 exposed from the sealing material 20 is covered with the lid 21. This can safely cut off a current without damaging peripheral parts upon current interruption.

Note that the constricted portion 24 can be exposed from the sealing material 20 by covering the constricted portion 24 with a mask which can be released from a mold after a resin is cured instead of providing the chassis 27. Alternatively, a height of the sealing material 20 may be made equal to or lower than the constricted portion 24.

Figure 10:
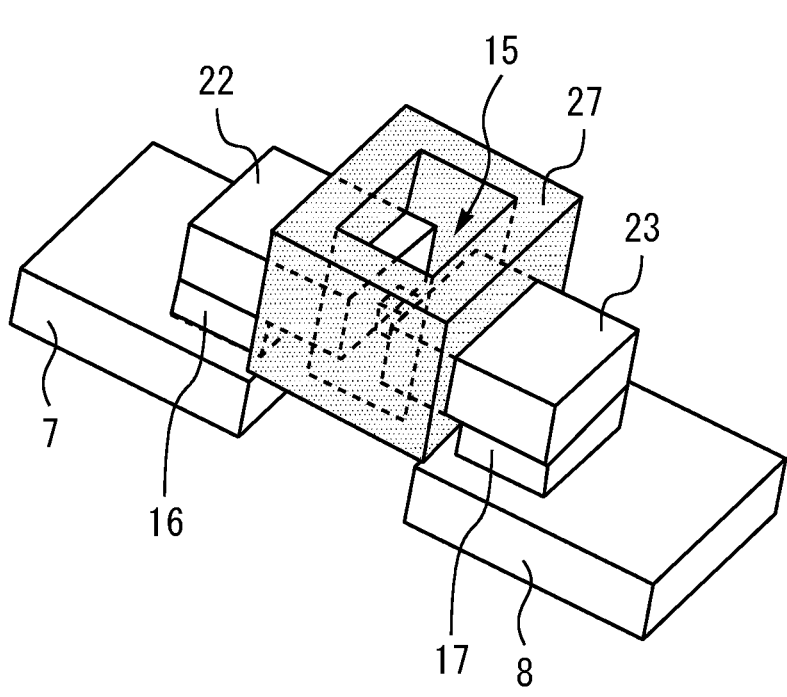
FIG. 10 is a perspective view illustrating a modified example of the overcurrent interruption mechanism according to the fourth embodiment.
Figure 11:
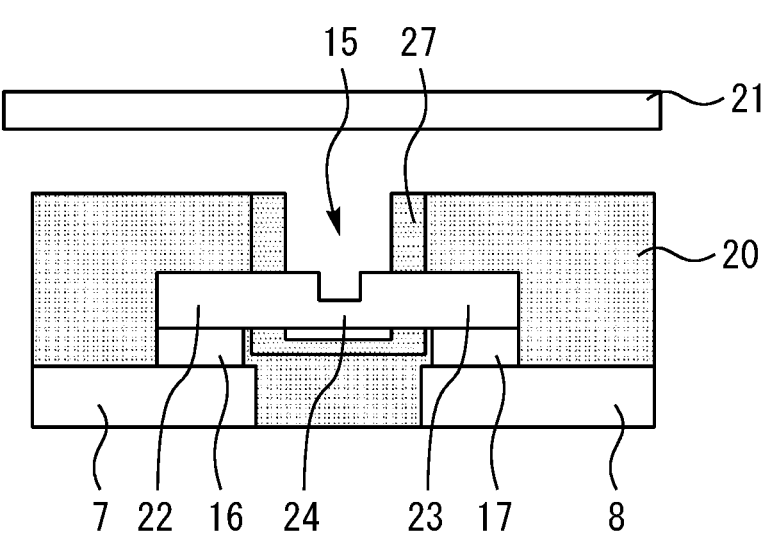
FIG. 11 is a cross-sectional view illustrating the modified example of the overcurrent interruption mechanism according to the fourth embodiment.

FIG. 10 is a perspective view illustrating a modified example of the overcurrent interruption mechanism according to the fourth embodiment. FIG. 11 is a cross-sectional view illustrating the modified example of the overcurrent interruption mechanism according to the fourth embodiment. The first and second conductor portions 22 and 23 do not constitute parallel plates, but have a structure similar to the structure in the first embodiment. Also in this case, the above-described effect can be obtained by the constricted portion 24 being exposed from the sealing material 20 and covered with the lid 21.

5

Fifth Embodiment

Figure 12:
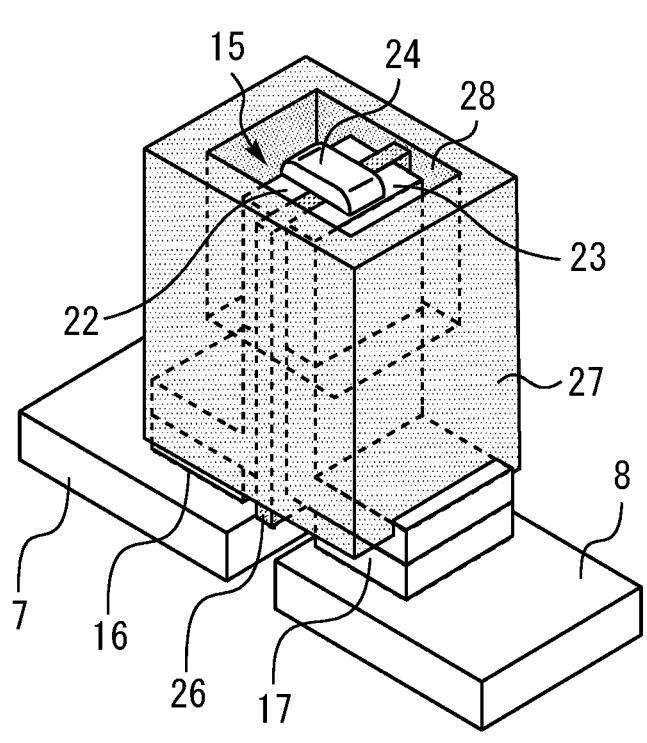
FIG. 12 is a perspective view illustrating an overcurrent interruption mechanism according to a fifth embodiment.
Figure 13:
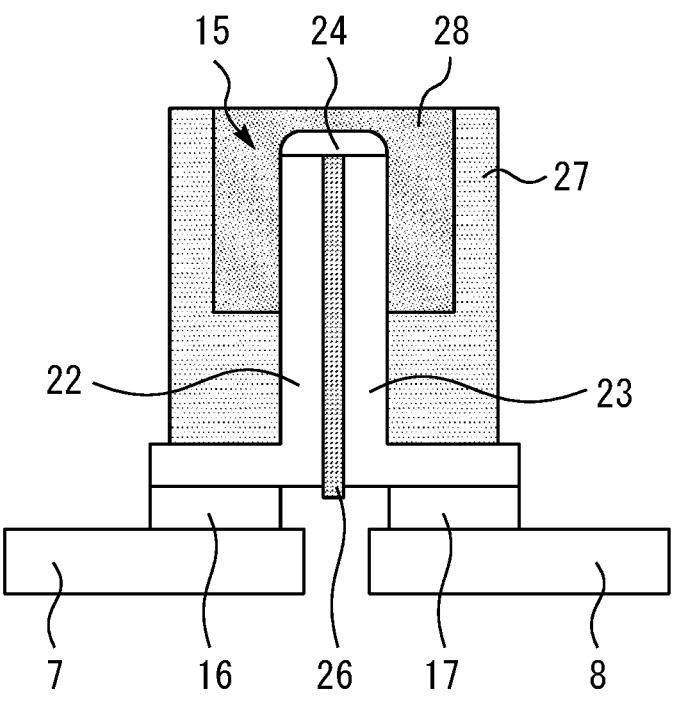
FIG. 13 is a cross-sectional view illustrating the overcurrent interruption mechanism according to the fifth embodiment.

FIG. 12 is a perspective view illustrating an overcurrent interruption mechanism according to a fifth embodiment. FIG. 13 is a cross-sectional view illustrating the overcurrent interruption mechanism according to the fifth embodiment. The constricted portion 24 exposed from the sealing material 20 is covered with an insulating material 28 formed of a material different from the sealing material 20. The insulating material 28 can prevent peripheral parts from being damaged upon current interruption. In this case, the lid 21 at the upper part of the device does not have to be provided.

Use of a material which has an effect of suppressing discharge upon interruption as the insulating material 28 can improve an interruption effect. Further, use of a material having low viscosity and high fluidity as the insulating material 28 can improve ease of assembly of the semiconductor device. The insulating material 28 is, for example, silicon gel and may be a low-viscosity epoxy material.

The semiconductor chip 10 is not limited to a chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-003999, filed on Jan. 14, 2021 including specification, claims, drawings and summary, on which the convention priority of the present application is based, is incorporated herein by reference in its entirety.

The invention claimed is:

1. A semiconductor device comprising:
an insulating substrate including a circuit pattern;
a semiconductor chip mounted on the insulating substrate and connected to the circuit pattern;
an overcurrent interruption mechanism constituted with a same material as a material of the circuit pattern, connected to the circuit pattern in series;
a base plate; and
a case joined on the base plate,
wherein when an overcurrent flows, the overcurrent interruption mechanism melts and is cut,
the insulating substrate is provided on the base plate inside the case,
the case includes an electrode,
the circuit pattern includes a first circuit pattern connected to the semiconductor chip and a second circuit pattern connected to the electrode,

one end of the overcurrent interruption mechanism is directly connected to the first circuit pattern with solder,
the other end of the overcurrent interruption mechanism is connected to the second circuit pattern with solder,
the overcurrent interruption mechanism includes a first conductor portion, a second conductor portion, and a constricted portion connected between the first conductor portion and the second conductor portion,
the first conductor portion is directly connected to the first circuit pattern with solder,
the second conductor portion is connected to the second circuit pattern with solder, and
the overcurrent interruption mechanism is a single integral piece of the same material as the material of the circuit pattern.

2. The semiconductor device according to claim 1, wherein cross-sectional areas of the first and second conductor portions are larger than a cross-sectional area of the constricted portion.

3. The semiconductor device according to claim 1, wherein lengths of the first and second conductor portions are longer than a length of the constricted portion.

4. The semiconductor device according to claim 1, wherein thicknesses of the first and second conductor portions are equal to or greater than 0.5 mm.

5. The semiconductor device according to claim 1, wherein the overcurrent interruption mechanism is constituted from one conductor.

6. The semiconductor device according to claim 1, wherein the first and second conductor portions constitute parallel plates standing erect with respect to an upper surface of the insulating substrate.

7. The semiconductor device according to claim 6, wherein an insulator is inserted between the first and second conductor portions which constitute the parallel plates.

8. The semiconductor device according to claim 1, further comprising:
a sealing material sealing the insulating substrate and the semiconductor chip; and
a lid,
wherein at least one surface of the constricted portion is exposed from the sealing material and is covered with the lid.

9. The semiconductor device according to claim 1, further comprising a sealing material sealing the insulating substrate and the semiconductor chip,
wherein at least one surface of the constricted portion is exposed from the sealing material and is covered with an insulating material formed of a material different from the sealing material.

10. The semiconductor device according to claim 1, wherein the semiconductor chip is formed of a wide-bandgap semiconductor.

11. The semiconductor device according to claim 1, wherein
lengths of the first and second conductor portions are each longer than a length of the constricted portion, the length of the constricted portion being measured in a direction in which current is configured to flow between the first conductor portion, the constricted portion, and the second conductor portion.

12. The semiconductor device according to claim 11, wherein cross-sectional areas of the first and second conductor portions are larger than a cross-sectional area of the constricted portion.

13. The semiconductor device according to claim 11, wherein thicknesses of the first and second conductor portions are equal to or greater than 0.5 mm.

14. The semiconductor device according to claim 11, wherein the first and second conductor portions constitute parallel plates standing erect with respect to an upper surface of the insulating substrate.

15. The semiconductor device according to claim 14, wherein an insulator is inserted between the first and second conductor portions which constitute the parallel plates.

16. The semiconductor device according to claim 11, further comprising:

a sealing material sealing the insulating substrate and the semiconductor chip; and a lid, wherein at least one surface of the constricted portion is exposed from the sealing material and is covered with the lid.

17. The semiconductor device according to claim 11, further comprising a sealing material sealing the insulating substrate and the semiconductor chip, wherein at least one surface of the constricted portion is exposed from the sealing material and is covered with an insulating material formed of a material different from the sealing material.

18. The semiconductor device according to claim 11, wherein the semiconductor chip is formed of a wide-band-gap semiconductor.

19. The semiconductor device according to claim 11, wherein the second circuit pattern is spaced from the first circuit pattern, and the length of the constricted portion is measured in a direction in which current is configured to flow within the constricted portion and between the first conductor portion and the second conductor portion.

20. The semiconductor device according to claim 11, wherein the second circuit pattern is spaced from the first circuit pattern, the first conductor portion is directly connected to the first circuit pattern via solder, the second conductor portion is directly connected to the second circuit pattern via solder, the constricted portion is directly connected to the first conductor portion and the second conductor portion, the lengths of the first and second conductor portions are each longer than a length of an entirety of the constricted portion, the length of the entirety of the constricted portion is measured in a direction in which current is configured to flow within the constricted portion and between the first conductor portion and the second conductor portion, and the lengths of the first and second conductor portions are measured along a current path through which current is configured to flow within the first and second conductor portions.

21. The semiconductor device according to claim 1, wherein the overcurrent interruption mechanism is the only overcurrent interruption mechanism connected between the semiconductor chip and the electrode.

22. The semiconductor device according to claim 1, wherein the overcurrent interruption mechanism is the only overcurrent interruption mechanism within the case.

23. The semiconductor device according to claim 1, wherein thicknesses of the first and second conductor portions are each equal to or greater than 0.5 mm, the thicknesses of the first and second conductor portions being measured in a first direction perpendicular to a second direction, the second direction being a direction in which current is configured to flow between the first conductor portion, the constricted portion, and the second conductor portion.

* * * * *